United States Patent
Ganta Papa Rao Bala

(10) Patent No.: US 8,797,732 B2
(45) Date of Patent: Aug. 5, 2014

(54) SERVER BACKPLANE

(75) Inventor: Kapil Rao Ganta Papa Rao Bala, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 292 days.

(21) Appl. No.: 13/411,760

(22) Filed: Mar. 5, 2012

(65) Prior Publication Data
US 2013/0229767 A1 Sep. 5, 2013

(51) Int. Cl.
*G06F 1/16* (2006.01)
*H05K 7/14* (2006.01)
*G11B 33/12* (2006.01)

(52) U.S. Cl.
CPC ............ *G06F 1/1656* (2013.01); *H05K 7/1487* (2013.01); *G11B 33/128* (2013.01); *G11B 33/124* (2013.01)
USPC ................................. 361/679.32; 361/679.37

(58) Field of Classification Search
CPC ..... H05K 7/1487; G06F 1/184; G06F 1/1616; G06F 1/1656; G06F 1/185; G11B 33/128; G11B 33/124
USPC ........................................ 361/679.32, 679.37
See application file for complete search history.

(56) References Cited

U.S. PATENT DOCUMENTS

| | | | | |
|---|---|---|---|---|
| 5,234,348 A | | 8/1993 | Konsevich et al. | |
| 5,579,204 A | * | 11/1996 | Nelson et al. | 361/679.32 |
| 5,816,673 A | * | 10/1998 | Sauer et al. | 312/223.2 |
| 5,912,799 A | * | 6/1999 | Grouell et al. | 361/679.32 |
| 5,978,821 A | * | 11/1999 | Freeny | 708/100 |
| 6,819,560 B2 | * | 11/2004 | Konshak et al. | 361/679.5 |
| 6,999,306 B2 | * | 2/2006 | Walczak et al. | 361/679.37 |
| 7,042,720 B1 | * | 5/2006 | Konshak et al. | 361/679.33 |
| 7,068,498 B2 | | 6/2006 | Bolich et al. | |
| 7,138,733 B2 | | 11/2006 | Sanders et al. | |
| 7,200,008 B1 | * | 4/2007 | Bhugra | 361/724 |
| 7,298,612 B2 | | 11/2007 | Malone | |
| 7,505,261 B2 | | 3/2009 | Reasoner et al. | |
| 7,583,507 B2 | * | 9/2009 | Starr et al. | 361/727 |
| 7,791,894 B2 | | 9/2010 | Bechtolsheim | |
| 7,864,538 B2 | * | 1/2011 | Wadsworth et al. | 361/727 |
| 8,009,385 B2 | * | 8/2011 | Starr et al. | 360/98.01 |
| 2004/0252453 A1 | | 12/2004 | Brooks et al. | |
| 2004/0252464 A1 | | 12/2004 | Dobbs et al. | |
| 2004/0253842 A1 | | 12/2004 | Barsun et al. | |
| 2005/0162830 A1 | | 7/2005 | Wortman et al. | |
| 2005/0219810 A1 | * | 10/2005 | Carlson et al. | 361/685 |
| 2007/0091559 A1 | * | 4/2007 | Malone | 361/685 |
| 2007/0230109 A1 | * | 10/2007 | Starr et al. | 361/685 |
| 2007/0230110 A1 | * | 10/2007 | Starr et al. | 361/685 |
| 2007/0230111 A1 | * | 10/2007 | Starr et al. | 361/685 |
| 2009/0257185 A1 | * | 10/2009 | Signer et al. | 361/679.32 |
| 2010/0118483 A1 | * | 5/2010 | Kurokawa et al. | 361/679.33 |
| 2010/0118484 A1 | * | 5/2010 | Sasagawa et al. | 361/679.37 |
| 2011/0096484 A1 | | 4/2011 | Hu et al. | |
| 2013/0286574 A1 | * | 10/2013 | Ganta Papa Rao Bala | 361/679.02 |

* cited by examiner

*Primary Examiner* — Lisa Lea Edmonds

(57) ABSTRACT

A server structure includes a chassis including at least one partition oriented in a plane, and a backplane tray slideably supported by the chassis in a direction substantially perpendicular to the plane of the at least one partition. The at least one partition forms a bay to receive at least one module, and the backplane tray supports a backplane including at least one electrical connector for the at least one module.

14 Claims, 3 Drawing Sheets

SERVER BACKPLANE

BACKGROUND

A computer server may include a chassis, one or more modules supported by the chassis, and a backplane providing one or more connectors for the modules. Access to the backplane (for example, for service of the backplane), however, often includes disassembly (or at least partial disassembly) of the chassis. Unfortunately, such disassembly may compromise the structural integrity of the chassis. In addition, such disassembly (and subsequent reassembly) may be time consuming.

DETAILED DESCRIPTION

In the following detailed description, reference is made to the accompanying drawings which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples of the present disclosure can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

The present disclosure provides a server structure which facilitates service and/or repair of a backplane of the server structure. More specifically, the server structure illustrated and described herein facilitates partial and/or complete removal of the backplane from a chassis of the server structure without disassembly of an internal framework of the chassis. As such, structural integrity of the chassis of the server structure may be maintained, and serviceability of the backplane may be enhanced.

Figure 1:
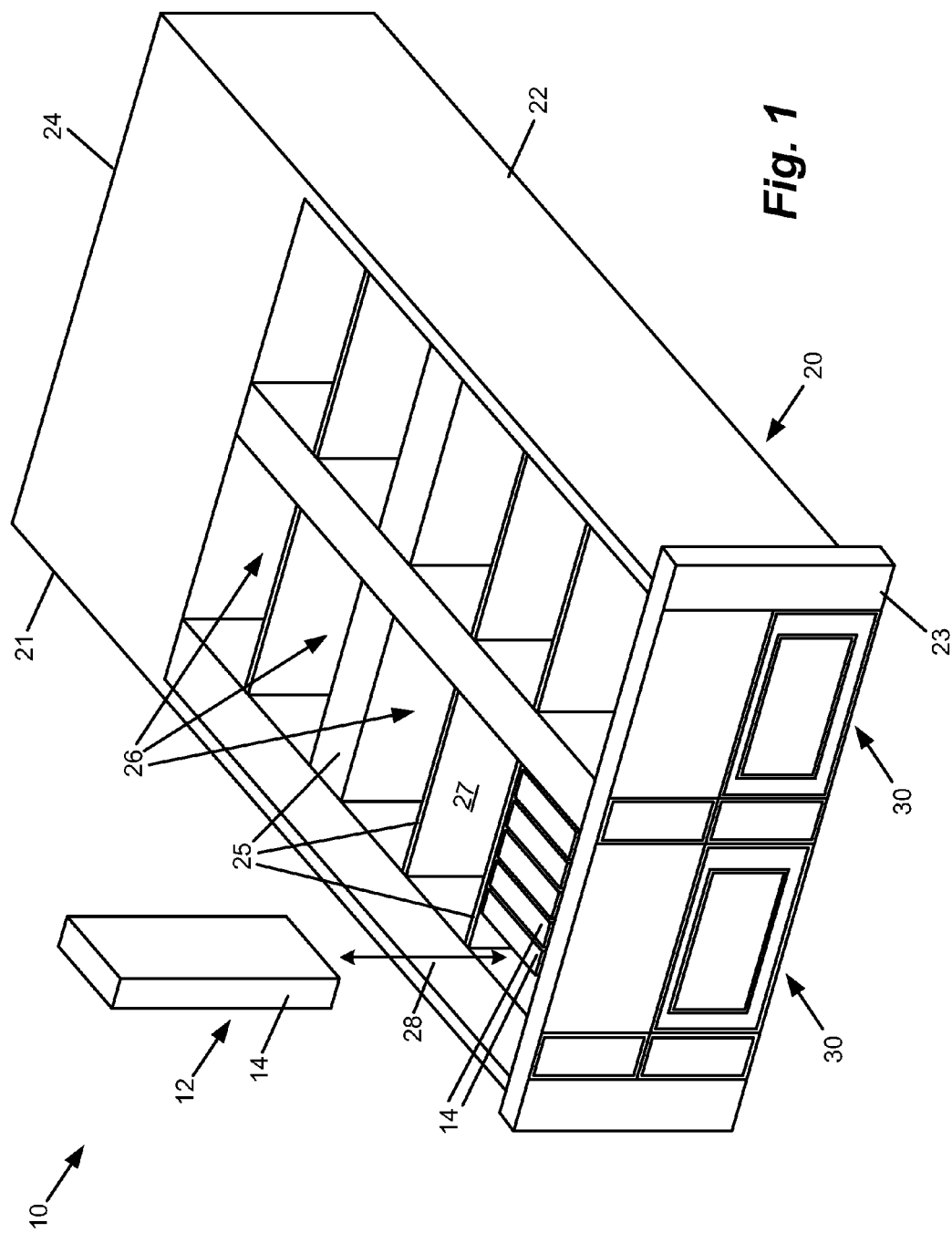
FIG. 1 is a schematic illustration of one example of a server structure.

FIG. 1 is a schematic illustration of one example of a server structure 10 for a computer system. Server structure 10 includes a chassis 20 to accommodate one or more modules 12, and a backplane 30 to facilitate electrical connection to modules 12. Modules 12 include devices which provide a variety of functions, and which are connected to backplane 30 either directly or by intermediate cables.

Examples of modules 12 include storage modules, server modules, switch modules, processor modules, memory modules, graphics modules, input/output (I/O) modules, power modules, or modules combining functions of one or more modules. In the example illustrated in FIG. 1, modules 12 include hard disk drives (HDD) 14. Hard disk drives 14, are supported by chassis 20 and directly connected to backplane 30, as described below.

Chassis 20 includes one or more structures to support and/or enclose modules 12. In one example, chassis 20 is rectangular in shape, and includes opposite sides 21 and 22, and opposite ends 23 and 24. In one example, end 23 represents a front of chassis 20, and end 24 represents a rear of chassis 20. The overall shape, size, and/or configuration of chassis 20 may vary depending upon the size, number, and/or type of modules supported or enclosed by chassis 20, and the intended function or operation of the computer system.

As illustrated in the example of FIG. 1, chassis 20 includes a plurality of panels or partitions 25 which form part of an internal framework to receive and support modules 12. In one example, partitions 25 are spaced within chassis 20 to form a plurality of bays 26 for modules 12. Bays 26 are arranged relative to each other, for example, in rows and/or columns. Although two columns of five rows each of bays 26 are illustrated in the example of FIG. 1, it is understood that chassis 20 may be configured with other numbers of columns and/or rows of bays 26, including one column and one row.

In one example, partitions 25 are oriented in a plane 27 substantially perpendicular to sides 21 and 22 of chassis 20, and substantially parallel with ends 23 and 24 of chassis 20. In addition, bays 26 are open in a direction substantially parallel with plane 27 (including, more specifically, a vertical axis of plane 27). Accordingly, and with reference to the orientation of FIG. 1, chassis 20 constitutes a top-load chassis with modules 12 loaded or inserted into chassis 20 in a substantially vertical direction represented by arrow 28. As such, the direction indicated by arrow 28 represents a direction substantially parallel with partitions 25 and plane 27.

In one example, bays 26 each include multiple slots for modules 12 such that multiple modules 12 are received within a single bay 26 of chassis 20. For example, and as illustrated in the example of FIG. 1, six modules are received within one bay 26. Although six modules are illustrated as being received within one bay 26, it is understood that bays 26 of chassis 20 may receive zero, one, or more than one module 12.

Figure 2:
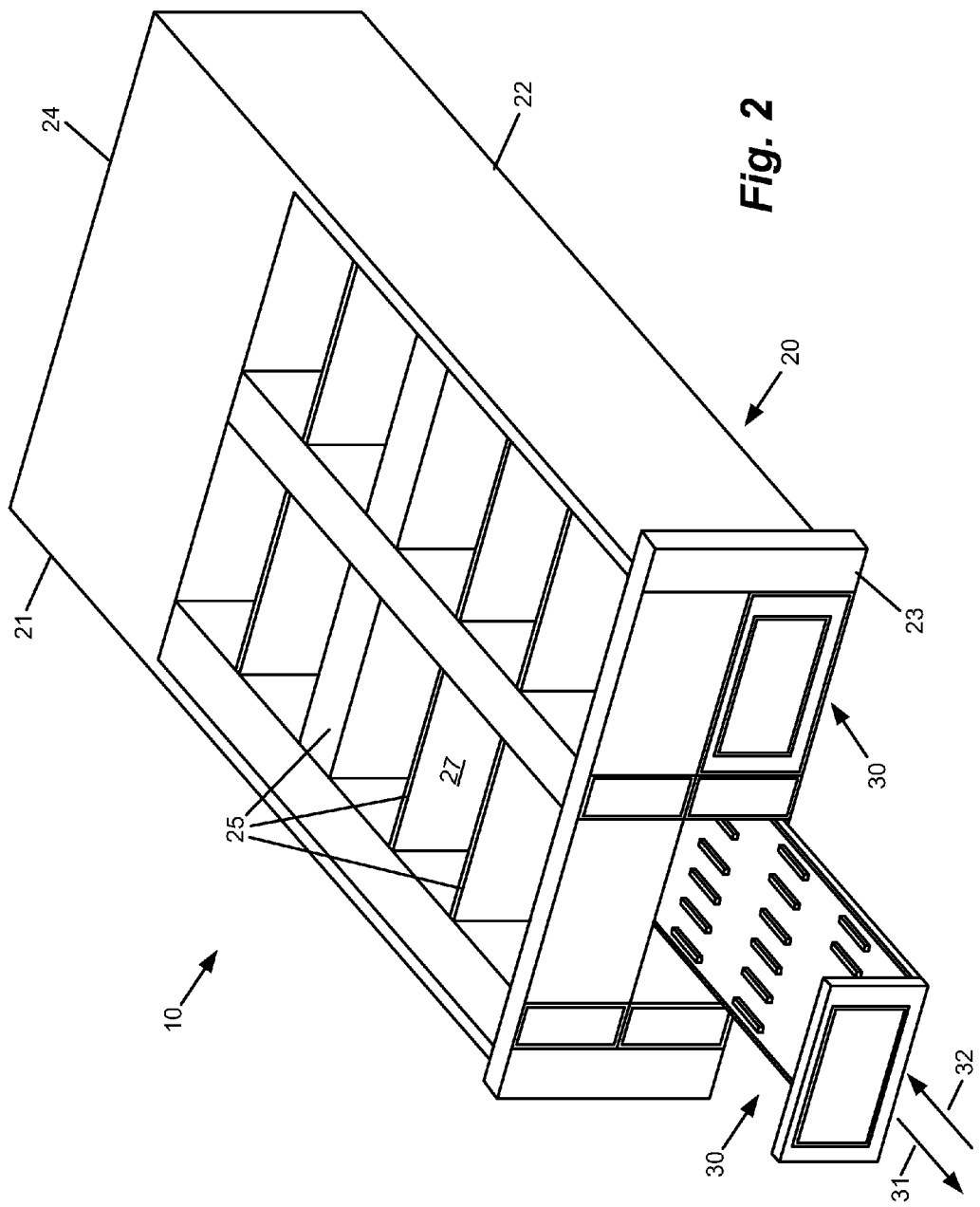
FIG. 2 is a schematic illustration of one example of removal/insertion of a backplane from/into the server structure of FIG. 1.

FIG. 2 is a schematic illustration of one example of removal of backplane 30 from server structure 10 and insertion of backplane 30 into server structure 10. More specifically, and as described below, backplane 30 is supported by chassis 20 so as to facilitate access and/or removal of backplane 30 from chassis 20 including, more specifically, access and/or removal of backplane 30 from end 23 of chassis 20. Accordingly, and with reference to the orientation of FIG. 2, backplane 30 constitutes a front-accessible/removable backplane.

As illustrated in the example of FIG. 2, backplane 30 is slideable relative to chassis 20. More specifically, backplane 30 is slideable out of and away from chassis 20 such that backplane 30 is removable from chassis 20. In one example, backplane 30 is slideable in a substantially horizontal direction represented by arrow 31. As such, the direction indicated by arrow 31 represents a direction substantially perpendicular to plane 27 of partition 25. In addition, the direction indicated by arrow 31 represents a direction substantially parallel with sides 21 and 22, and substantially perpendicular to end 23 of chassis 20. Backplane 30 is also slideable into chassis 20 in a direction represented by arrow 32 opposite the direction represented by arrow 31.

Figure 3:
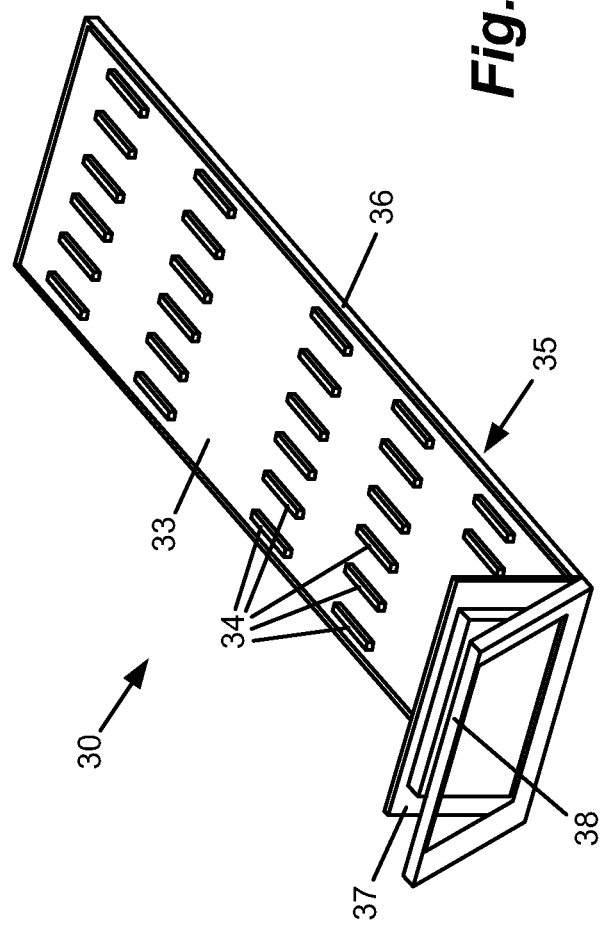
FIG. 3 is a schematic illustration of one example of the backplane of FIG. 2.

FIG. 3 is a schematic illustration of one example of backplane 30. Backplane 30 generally includes a printed circuit board (PCB) 33, and a plurality of connectors 34. Printed circuit board 33 may comprise a flat sheet of one or more layers, and may include electrically conductive traces and vias, and electrical components such as capacitors, resistors, inductors, integrated circuits, and the like.

Connectors 34 are supported by PCB 33 and provide points of electrical connection for modules 12 (FIG. 1). More specifically, connectors 34 provide data connections and/or power connections for modules 12. In one example, multiple connectors 34 are aligned and are spaced relative to each other to form spaced rows of connectors 34 for modules 12 received in corresponding bays 26 of chassis 20 when backplane 30 is substantially fully positioned within chassis 20 (see FIG. 1).

In one example, backplane 30 is supported by a backplane tray 35. Backplane tray 35 is slideably supported within chassis 20 for movement between a position where backplane tray 35 and, therefore, backplane 30, is substantially fully positioned within chassis 20, and one or more additional positions where backplane tray 35 and, therefore, backplane 30, is at least partially removed or fully removed from chassis 20.

In one example, backplane tray 35 includes a base 36 to support PCB 33 of backplane 30, and a panel 37 at an end of base 36. More specifically, panel 37 is provided at an end of backplane tray 35 corresponding to end 23 of chassis 20 such that panel 37 forms a portion of end 23 of chassis 20 when backplane tray 35 is substantially fully positioned within chassis 20 (see FIG. 1). In addition, a handle 38 is associated with panel 37 for grasping by an individual to facilitate sliding of backplane tray 35 and removal of and insertion of backplane tray 35 and, therefore, backplane 30, from and into chassis 20. In one example, handle 38 is pivotally coupled to backplane tray 35 and/or panel 38 such that handle 38 may be stowed and secured in an upright position as a bezel around panel 37 when backplane tray 35 is substantially fully positioned within chassis 20, and pivoted away from panel 37 when backplane tray 35 is to be (partially or fully) removed from chassis 20.

As illustrated in the examples of FIGS. 1-3, server structure 10 facilitates access to backplane 30 for service and/or repair of backplane 30. More specifically, and as illustrated and described above, backplane 30 may be slid relative to chassis 20 in a horizontal and forward or front direction to at least partially remove or withdraw backplane tray 35 and, therefore, backplane 30, from chassis 20 for access to backplane 30. To further facilitate service and/or repair of backplane 30, server structure 10 facilitates complete removal or withdraw of backplane 30 from chassis 20 by permitting further sliding of backplane 30 forward from and relative to chassis 20.

In one example, to facilitate sliding of backplane 30 relative to chassis 20, modules 12 are disconnected from backplane 30 and, more specifically, disconnected from connectors 34 of backplane 30, by removing (or at least partially removing) modules 12 from chassis 20. For example, modules 12 may be completely removed from chassis 20, or may be partially removed from chassis 20 just enough to disconnect modules 12 from connectors 34 such that modules 12 remain partially within respective slots of bays 26 of chassis 20.

The configuration of server structure 10 illustrated and described herein facilitates access to and removal of backplane 30 without disassembly of server structure 10. More specifically, server structure 10 facilitates access to and removal of backplane 30 without disassembly of the internal framework of chassis 20. For example, access to and removal of backplane 30 is facilitated without removal of partitions 25 (or other internal supports) of chassis 20. Accordingly, structural integrity of chassis 20 may be maintained while providing access to and removal of backplane 30.

In addition, with the configuration of server structure 10 illustrated and described herein, the time-consuming task of disassembly (and subsequent reassembly) of chassis 20 may be avoided for service and/or repair of backplane 30. Thus, serviceability of backplane 30, for example, from a perspective of time and effort, may be enhanced. Furthermore, the configuration of server structure 10 illustrated and described herein facilitates access to and removal of backplane 30 while chassis 20 remains positioned in and/or supported by a rack or other vertical support unit.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A server structure, comprising:
   a chassis including at least one partition oriented in a plane, the at least one partition forming a bay to receive at least one module; and
   a backplane tray slideably supported by the chassis in a direction substantially perpendicular to the plane of the at least one partition, the backplane tray to support a backplane including at least one electrical connector for the at least one module, wherein the backplane tray comprises a base to support a printed circuit board including the at least one electrical connector, an end panel provided at one end of the base, and a handle associated with the end panel.

2. The server structure of claim 1, wherein the plane comprises a substantially vertical plane, and wherein the direction comprises a substantially horizontal direction.

3. The server structure of claim 1, wherein the bay is open in a direction substantially parallel with the partition.

4. The server structure of claim 1, wherein the bay is open to a top of the chassis to provide a top-load chassis for the at least one module, and wherein the backplane tray is slideable from a front of the chassis to provide a front-accessible backplane tray for the backplane.

5. The server structure of claim 1, wherein the at least one module comprises a hard disk drive, and wherein the at least one electrical connector of the backplane comprises at least one electrical connector for the hard disk drive.

6. A server structure, comprising:
   a chassis including first and second bays to receive insertion of first and second modules in a first direction; and
   a backplane tray supported by the chassis to support first and second electrical connectors for the first and second modules, wherein the backplane tray is slideable relative to the chassis in a second direction substantially perpendicular to the first direction, wherein the backplane tray comprises a base to support a printed circuit board including the first and second electrical connectors, an end panel provided at one end of the base, and a handle associated with the end panel.

7. The server structure of claim 6, wherein the first direction is substantially vertical, and wherein the second direction is substantially horizontal.

8. The server structure of claim 6, wherein the first and second bays are arranged in the second direction relative to each other.

9. The server structure of claim 6, wherein the first and second electrical connectors are spaced in the second direction relative to each other.

10. The server structure of claim 6, wherein the first and second modules comprise hard disk drives, and wherein the first and second electrical connectors comprise electrical connectors for the hard disk drives.

11. A server chassis, comprising:
- first structure to support at least one module and to receive insertion of the at least one module in a first direction; and
- second structure to support a backplane for the at least one module and to slide the backplane relative to the first structure to support the at least one module in a second direction substantially perpendicular to the first direction, wherein the second structure comprises a backplane tray including a base to support a printed circuit board including a first electrical connector and a second electrical connector, an end panel provided at one end of the base, and a handle associated with the end panel.

12. The server chassis of claim 11, wherein the first direction is substantially vertical, and wherein the second direction is substantially horizontal.

13. The server chassis of claim 11, wherein the first structure to support the at least one module comprises at least one bay open in the direction.

14. The server chassis of claim 11, wherein the backplane tray is removable from the server chassis in the second direction.

* * * * *

UNITED STATES PATENT AND TRADEMARK OFFICE
CERTIFICATE OF CORRECTION

| | | |
|---|---|---|
| PATENT NO. | : 8,797,732 B2 | Page 1 of 1 |
| APPLICATION NO. | : 13/411760 | |
| DATED | : August 5, 2014 | |
| INVENTOR(S) | : Kapil Rao Ganta Papa Rao Bala | |

It is certified that error appears in the above-identified patent and that said Letters Patent is hereby corrected as shown below:

In the Claims

In column 5, line 21, in Claim 13, delete "the" and insert -- the first --, therefor.

Signed and Sealed this
Third Day of March, 2015

Michelle K. Lee
*Deputy Director of the United States Patent and Trademark Office*